United States Patent [19]
Bell

[11] Patent Number: 5,535,330
[45] Date of Patent: Jul. 9, 1996

[54] SYSTEM AND METHOD FOR ERROR LOCATION IN PRINTED WIRE ASSEMBLIES BY EXTERNAL POWER ON SELF TEST (POST) COMMANDS

[75] Inventor: James S. Bell, Cedar Park, Tex.

[73] Assignee: Dell USA, L.P., Austin, Tex.

[21] Appl. No.: 279,759

[22] Filed: Jul. 22, 1994

[51] Int. Cl.$^6$ .................................................... G06F 11/34
[52] U.S. Cl. ...................................... 395/183.12; 371/48
[58] Field of Search ............................ 395/575, 183.01, 395/183.07, 183.12; 371/16.5, 22.5, 15.1, 18, 25.1, 29.1

[56] References Cited

U.S. PATENT DOCUMENTS

| | | | |
|---|---|---|---|
| 4,620,302 | 10/1986 | Binoeder et al. | 371/25.1 |
| 5,245,615 | 9/1993 | Treu | 311/16.5 |
| 5,371,884 | 12/1994 | Ross | 395/575 |

OTHER PUBLICATIONS

Ron White "How Computers Work" pp. 5–11, 1993.

*Primary Examiner*—Robert W. Beausoliel, Jr.
*Assistant Examiner*—Albert T. Decady
*Attorney, Agent, or Firm*—Henry N. Garrana; Mark P. Kahler; Michelle M. Turner

[57] ABSTRACT

A system for detecting and locating errors in printed wire assemblies contained in a device with capabilities of performing a power on self test (POST) comprised of testing subroutines. The system monitors the device during execution of the POST. If a run error occurs during the POST, the system, through its monitoring, receives an indication of the run error. The system then delivers to the device a command, external to the POST routine, which directs the POST routine to thereafter separately execute each of the testing subroutines of the POST. If a run error occurs in any testing subroutine as it is being separately executed, a signal indicative of the run error and particular testing subroutine in which it occurred is sent to the system. The system, in this manner, may track a particular printed wire assembly and, with information about where within the printed wire assembly execution steps of the particular testing subroutine occur, determine the source within the printed wire assembly of the failure which caused the run error.

18 Claims, 4 Drawing Sheets

SYSTEM AND METHOD FOR ERROR LOCATION IN PRINTED WIRE ASSEMBLIES BY EXTERNAL POWER ON SELF TEST (POST) COMMANDS

BACKGROUND OF THE INVENTION

1. Field of the Invention

The invention relates generally to a system and method for locating failure errors which occur in electronic printed wire assemblies (herein "PWA's"), and, more particularly, to a system for and method of passing external commands to a power on self test (herein "POST") upon detection of an error in POST execution in order to cause particular modules of the POST to again execute thereby narrowing and detecting location of the error in a PWA.

2. Description of the Related Art

A wide variety of electronic devices employ printed wire assemblies. Printed wire assemblies, in general, are intricate networks of integrated electrical paths and devices formed on a stable insulating sheet of material. Today, the process of manufacturing PWA's has been perfected to the point that problems in those devices due to manufacturing are fairly limited. Even so, problems in those devices do continue to arise as a result of imperfect manufacture. Other, and probably more frequent, causes of errors in PWA's include breakdown of materials of those assemblies due to varied stresses, such as certain use and environmental conditions, and, in fact, even the multitude of different environmental conditions to which the assemblies are subjected in use can yield varying results, or errors, due to varying material properties and functions thereof under those different conditions.

Environmental Stress Screening (herein "ESS") is a process by which manufacturers seek to screen their PWA's to determine which PWA's are likely to exhibit errors in the field. In practice, ESS is employed to subject PWA's to conditions in which the PWA's might be expected to be used. For example, a typical ESS process will seek to replicate the conditions of use of a PWA at some point in the life of the PWA. By replicating expected application and field conditions for a specified time duration, latent defects can become detected, and it may be better determined which PWA's are likely candidates for failure problems. This is especially so during a critical 0–60 days after assembly of the PWA when latent problematic conditions may occur at a customer site, which adds cost to rectify.

ESS techniques are helpful in determining which PWA's are likely to fail, however, it is difficult if not impossible to track the source of any failure. This is because tracking the source requires accurate timing of the test through the circuitry of the PWA. For example, certain failures during ESS testing may not allow for an end resulting error code to be externally generated. The failure may occur well into the ESS procedure and cause the PWA to "hang" in a particular state. Once this has occurred, there may be no external error code generated or any generated code may not accurately pinpoint the first source of error occurrence. ESS failure reporting techniques, therefore, have not necessarily been helpful in resolving errors in all cases because either the field conditions can not be exactly duplicated at a repair station or the particular source within any particular PWA of likely errors can not be pinpointed with certainty, due to several environmental conditions which are difficult to duplicate at a repair station, one of which is the temperature at the time of failure.

Most devices employing PWA's are equipped to perform a power on self test (POST) on themselves prior to loading of operating system instructions or other particular desired instructions or functions. The purpose of the POST has generally been to determine, in each instance of use of a device in the field, whether the device will suitably and accurately function in that instance of use. An example of a representative device which employs PWA's is a personal computer. When a personal computer is turned on or an operating system is "booted", the personal computer first executes a POST before performing other functions or operations. The POST is typically part of the basic input/output system (BIOS) of the computer. Generally, the POST will act to check the circuitry and operation of the computer's PWA's in order to assure that, in the particular instance of use, the PWA's will function without error and will operate with proper set-up options given the particular peripherals and internals of the computer.

Though the POST indicates whether the computer will function properly in the particular instance of use, that is typically the only indication from the POST. If the POST indicates an error in a PWA, the computer gives a status and error message. That status and error message does not direct one monitoring the results of the POST to a particular location within the computer at which the error occurred. This is because, in the prior technology, the POST function occurs only once prior to loading further instructions, such as an operating system. Further, though monitoring electronics can detect a PWA failure during a POST routine, there has been no known means to cause the POST or some other mechanism to generate a response indicative of location within the PWA of the failure.

Because ESS techniques lack the ability of accurate replication of field conditions and pinpointing of errors by timing measurements, and because POST techniques lack the ability to trigger the POST or some other mechanism to respond to failures pinpointing locations of error sources, it becomes apparent that a means for performing ESS-like tests under actual field conditions and also pinpointing sources within a PWA of any errors would be a valuable tool for PWA manufacturers and PWA repair centers. The fact that the prior art lacks such a tool is a problem of the prior art.

SUMMARY OF THE INVENTION

Accordingly, an object of the present invention is to provide a method for locating sources within PWA's of errors encountered under actual operating conditions of the PWA's.

Another object of the present invention is to provide a method to pass commands to a POST process in order to narrow down the actual failure mode which may have occurred in a complex POST test.

Yet another object of the present invention is to provide an improved method for troubleshooting failures which occur in either an ESS process or a field service repair effort.

In one embodiment, the invention is a system for detecting and locating failure errors in printed wire assemblies contained in a device capable of performing a power on self test comprised of testing subroutines, the printed wire assemblies being tracked through a manufacturing process by a factory tracking system. The system comprises circuitry for monitoring the device to determine whether a run error results on execution of the power on self test, the circuitry for monitoring being in communication with the device;

circuitry for generating a command to the device in response to detection of the run error by the circuitry for monitoring, the circuitry for generating being in communication with the circuitry for monitoring; circuitry for causing the power on self test to separately execute the testing subroutines, the circuitry for causing being in communication with the circuitry for generating and being activated to begin separately executing the testing subroutines of the power on self test upon receipt by the device of the command from the circuitry for generating; and circuitry for signalling the system when a subroutine run error occurs during separate execution of the testing subroutines, the circuitry for signalling being in communication with the system.

In another aspect, the system locates the failure errors in printed wire assemblies, at least in part, by detecting which of the testing subroutines was then running at the time the subroutine run error occurred.

In another embodiment, the invention is a system for detecting and locating failure errors in primed wire assemblies contained in a device capable of performing a power on self test comprised of testing subroutines, the printed wire assemblies being tracked through a manufacturing process by a factory tracking system. The system comprises circuitry for connecting with the device to monitor the power on self test for an error signal from the device due to run error in the power on self test and to deliver a command signal to the device, the command signal directing the power on self test to separately execute each of the testing subroutines; circuitry for detecting run error during execution of any of the testing subroutines; circuitry for determining in which of the testing subroutines the run error occurs; and circuitry for communicating to the system in which of the testing subroutines the run error occurs.

In another aspect, the circuitry for connecting includes monitoring electronics, a host system, and a factory tracking system.

In another embodiment, the invention is a method for detecting and locating failure errors in primed wire assemblies contained in a device capable of performing a power on self test comprised of testing subroutines, the printed wire assemblies being tracked through a manufacturing process by a factory tracking system. The method comprises the steps of monitoring the device to determine whether a run error results on execution of the power on self test; generating a command to the device in response to detection of the run error by the means for monitoring; separately executing each of the testing subroutines in response to the command; and signalling the system when a subroutine run error occurs during separate execution of the testing subroutines.

In another embodiment, the invention is a method for detecting and locating failure errors in printed wire assemblies contained in a device capable of performing a power on self test comprised of testing subroutines, the printed wire assemblies being tracked through a manufacturing process by a factory tracking system. The method comprises the steps of connecting with the device to monitor the power on self test for an error signal from the device due to run error in the power on self test and to deliver a command signal to the device, the command signal directing the power on self test to separately execute each of the testing subroutines; detecting run error during execution of any of the testing subroutines; determining in which of the testing subroutines the run error occurs; and communicating to the system in which of the testing subroutines the run error occurs.

Thus, the present invention offers the advantage of providing improved troubleshooting capabilities of failures which occur in an ESS process relative to the prior art. The PWA testing facility of the present invention also has the advantages of being quicker and more accurate than prior art PWA testing facilities and allows for duplication of the failure environment to be quickly duplicated at a repair station as a result.

BRIEF DESCRIPTION OF THE DRAWINGS

For a more complete understanding of the present invention and for further objects and advantages thereof, reference may now be had to the following description in conjunction with the accompanying drawings, in which.

DETAILED DESCRIPTION

Figure 1:
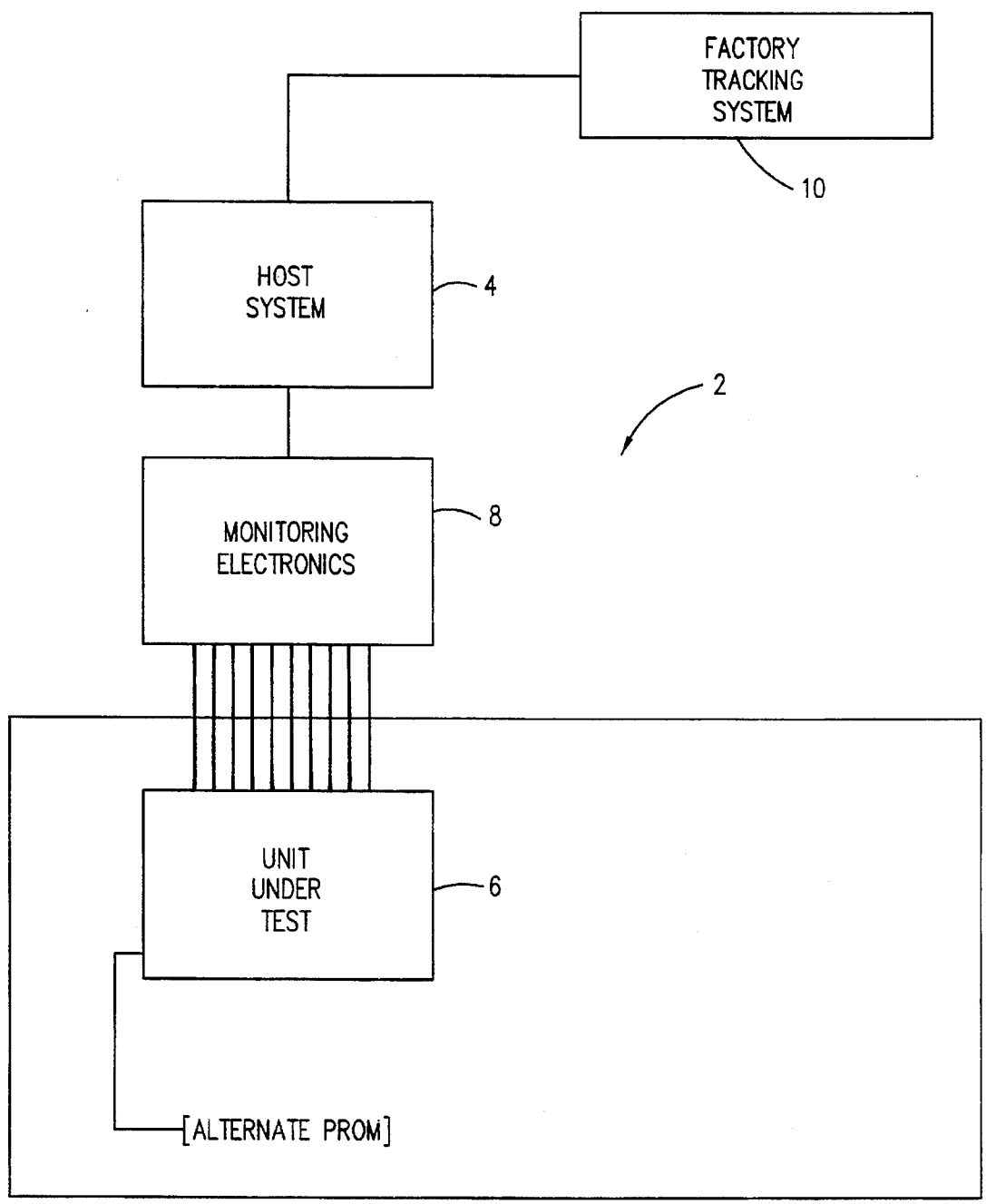
FIG. 1 is a simplified, illustrative depiction of an exemplary testing assembly according to the teachings of the present invention for testing a PWA of a unit under test by the method of the present invention which serves to better pinpoint the source of a PWA failure error.

Referring first to FIG. 1, an exemplary testing assembly 2 according to the teachings of the present invention for testing a PWA by the method of the present invention is illustrated. This assembly 2 includes a host system 4, for example, a personal computer, which controls the testing and to which is connected certain monitoring electronics 8. The monitoring electronics 8 are of a type appropriate for the particular testing. The host system 4 is equipped internally or peripherally with a factory tracking system 10, which system 10 may include a desired marking, identifying, and tracing mechanism. An example of such a factory tracking system 10 is a database that tracks PWA's through the manufacturing process and accumulates data relevant to the manufacture and testing of each of the PWA's. The monitoring electronics 8 serve for connection with a unit under test ("UUT") 6 which contains a PWA being tested.

Still referring to FIG. 1, from a hardware perspective, any or all of the host system 4, monitoring electronics 8, and factory tracking system 10 may be combined in the same physical unit or may be separate physical units merely connected with the other physical units by suitable electronic circuitry. The various units of the arrangement 2 are shown in FIG. 1 as separate units merely for ease of illustration and explanation of the concepts of the invention herein. It is to be expressly understood that all of the figures included herewith which depict units which could be separate hardware pieces are intended only to give a better understanding of the concepts of the invention and are not intended to limit the invention to a particular hardware configuration or arrangement.

Continuing still to refer to FIG. 1, the relative electrical connections between the host system 4, monitoring electronics 8, and factory tracking system 10, and the UUT 6 being tested, are shown. It may be noted that the host system 4 is in electrical communication with the monitoring electronics 8 and the factory tracking system 10. The host system 4 is also in electrical communication with the UUT 6 through connection of the monitoring electronics 8 to the UUT 6.

Briefly now discussing the prior art for a better understanding of the present invention, in the typical ESS process of the prior art, the manufacturer subjects each PWA to certain ESS processes at conclusion of the manufacture of the PWA. Through those ESS processes, the manufacturer slightly "ages" the PWA and attempts to accurately simulate the possible operating and use conditions of the PWA in its actual application in a product device (e.g., the UUT 6 of FIG. 1) for the desired life of the PWA. By means of this "aging" and simulation, the manufacturer attempts to determine the sufficiency, adequacy, and accuracy of the PWA for its expected use in a product device by the end user. As may be expected, all conditions in which the PWA may in fact be used in actual application in a product device can not be accurately simulated. Because there are limits to the accuracy of the simulation of actual conditions in any ESS process performed, those processes can not exactly determine the sufficiency, adequacy and accuracy of a particular PWA for a particular application and use. It is the desire to induce any possible "infant mortality", or to determine substandard component devices at the earliest possible manufacturing step in order to increase yield and reduce field failure.

Further, prior technology ESS techniques have not been particularly useful in pinpointing the source(s) within a particular PWA of any errors that may occur during ESS processing. This is the case because ESS techniques apply external stimuli, for example, particular electrical signals under particular environmental conditions, to the PWA and then detect the PWA's response to that stimuli. Detection of the source of any error in the PWA operation can be determined only by tracking electrical signals through the PWA and by monitoring the environmental conditions present at the time of failure. These signals must be tracked in a manner so that they may be pinpointed at particular locations in the PWA at times coinciding with the occurrence of errors. As can readily be appreciated, tracing and locating signals within a PWA to coincide with error occurrence is neither an easy or accurate process.

Still briefly discussing the prior art, in actual use of PWA's in application in a product device, the PWA's will typically be tested at the start of each use of the device by a self testing mechanism built into the device, for example, a POST. An example of such a device that will initially perform a POST upon power up or "boot" is a personal computer. When booted, a personal computer executes a particular set of operations (i.e., the POST) which test particular aspects of the computer, including the PWA's of the device. Though POST's at each boot evaluate the computer's PWA's to determine whether operational errors will result, the prior technology POST's will only signal the occurrence of an error in the device's PWA's. The POST will not locate and indicate the source of the error.

Figure 2:
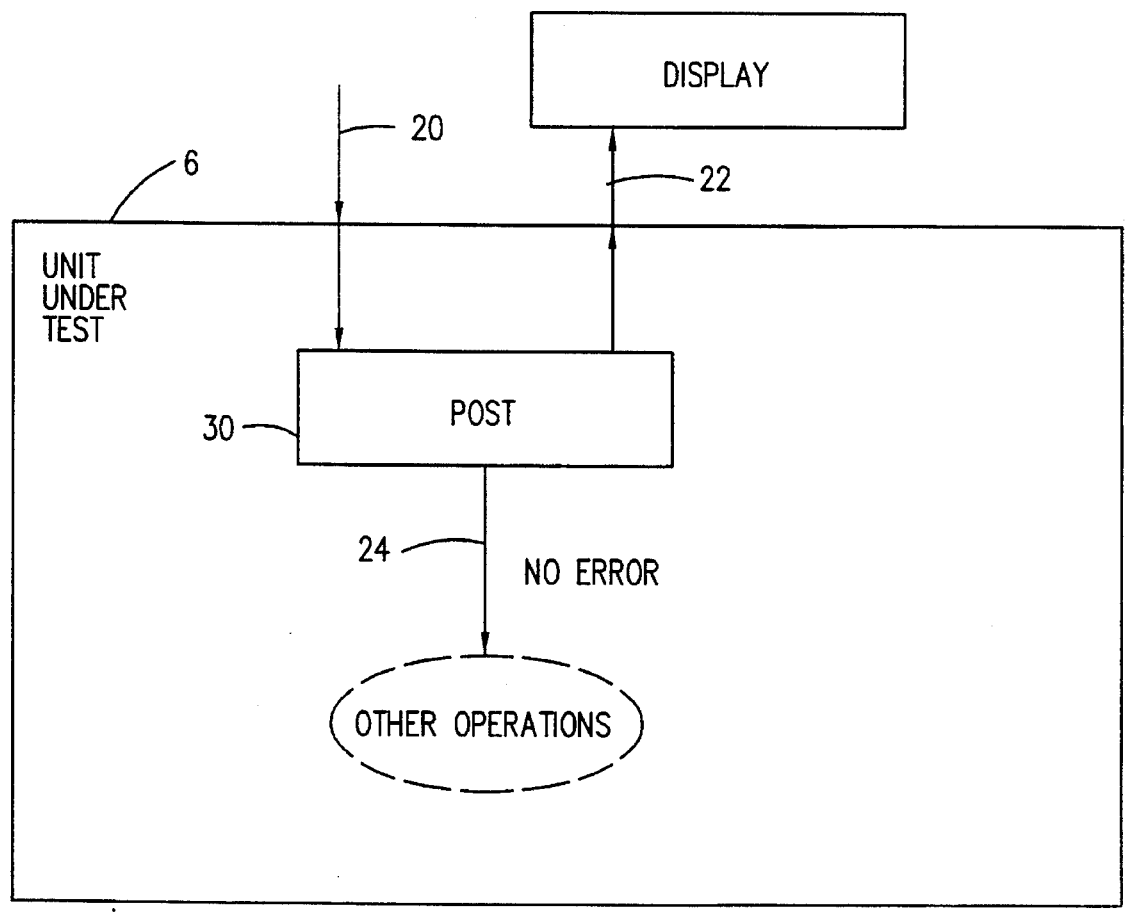
FIG. 2 is a simplified flow diagram of operation of a prior art POST in a device like that of FIG. 1.

Referring now to FIG. 2, a flow diagram of the operation of a POST 30 of the prior art in a UUT 6 employing PWA's is shown. A power on or boot signal on line 20 initiates execution of the POST 30. The POST 30 functions only once prior to loading of further instructions 24, such as an operating system. Because the entire POST 30 is executed only once within the UUT 6 upon boot, status and error messages 22 from the POST 30 only represent that a particular test has begun and that an error, if applicable, has occurred. The status and error messages 22 give no indication of location of the error within a PWA of the UUT 6, and an error condition may not make it possible to display the error message itself.

Figure 3:
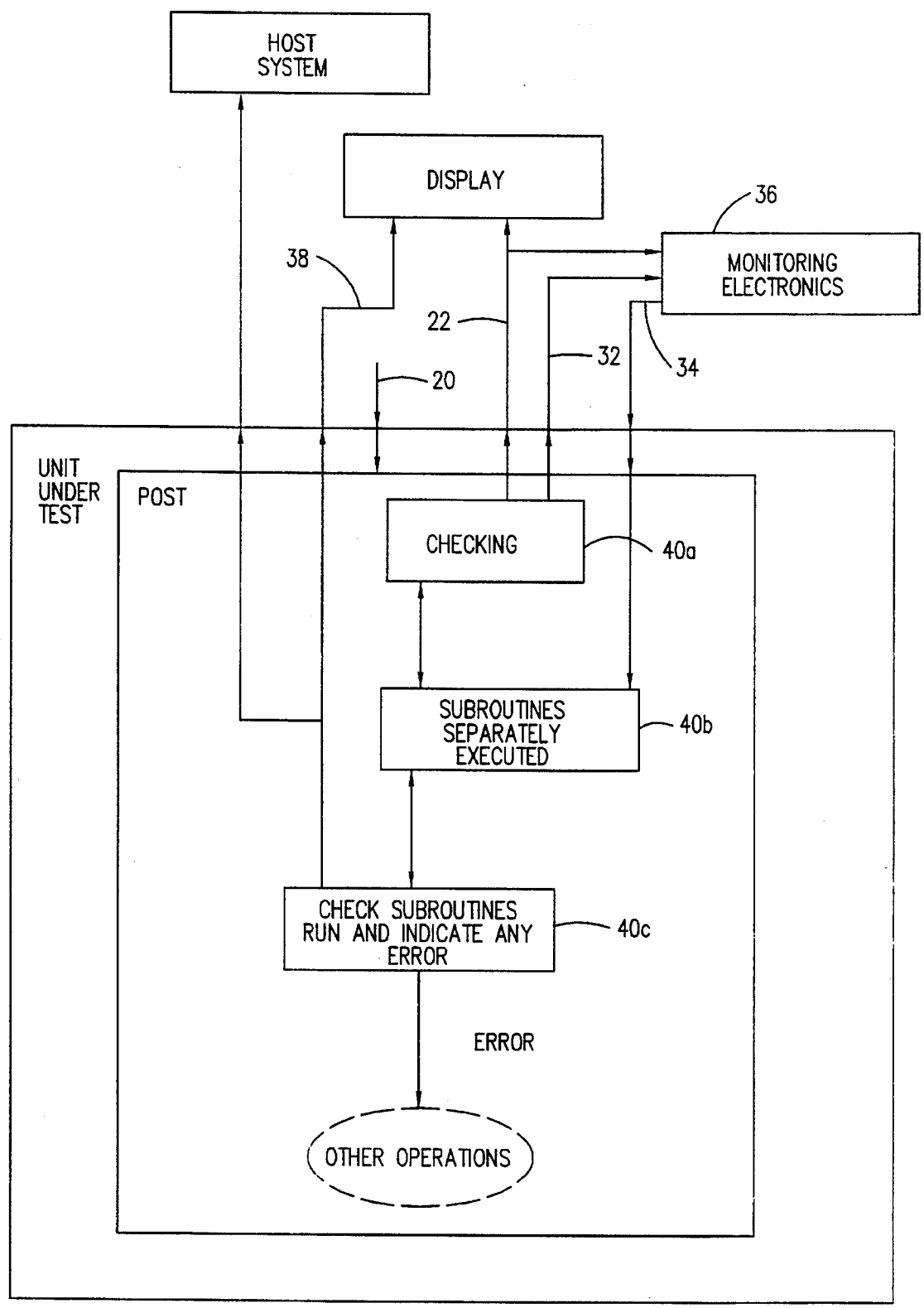
FIG. 3 is a simplified flow diagram of the method of error location by external POST commands of the present invention in a device like that of FIG. 1.

Referring now to FIG. 3, a flow diagram of the method of the present invention for locating a source of error in a PWA of a UUT 6 is shown. The present invention method requires a new, expanded POST 40 and use of an additional communication port pin of the UUT 6 (not shown in detail, but exemplified by signal 34) for receiving external commands to the POST 40 from the monitoring electronics 36. The hardware assembly for the present method can be best understood by referring back to FIG. 1. As previously noted, however, the particular hardware of the assembly 2 (shown in FIG. 1) is not as important to the invented system and method as the concepts described herein.

Continuing to refer to FIG. 3, the method of the present invention generally involves a POST 40 which includes testing subroutines (or modules) found in the POST 30 of the prior art (FIG. 2), but which is also expanded to include additional subroutines (or modules) 40a,40b,40c and has looping capability to re-execute the testing subroutines (or modules). One function of the additional subroutines 40a is to provide for checking 32 a communication port (not shown in detail) of the UUT 6 in FIG. 1 for a signal indicating that an error 22 has been detected in performing the POST 40. If the check signal 32 notes a particular signal at the communication port indicative of an error 22 (for example, that the port is being either pushed high or pulled low indicating error, as set according to design), then other functions of the additional subroutines 40b of the POST 40 are executed. Those subroutines 40b cause the POST 40 to loop and begin again executing each testing subroutine of the POST 40 separately. As each of the testing subroutines of the POST 40 is separately executed, other functions of the additional subroutines 40b check each testing subroutine run and determine whether any error occurs in the particular run. If these functions of the additional subroutines 40b determine an error in the running of a testing subroutine, a signal 38 is passed by the POST 40 externally to the assembly 2 (shown in FIG. 1), for example, to the host system 4, the monitoring electronics 8, the factory tracking system, and/or some other external apparatus which is capable of storing, identifying, and tracking data relevant to the particular testing subroutine run error and the particular UUT 6 tested.

Referring still to FIG. 3, though illustrated in the flow diagram in FIG. 3 as separate signal lines, signals 22,32,38 could be transmitted over the same circuit lines and communicated externally via the same communication port. Only the externally generated command signal 34 to the POST 40, signalling the POST 40 to loop and begin separately executing each testing subroutine, requires use of a separate communication port pin. That separate port pin for delivering the external command signal 34 to the POST may be dedicated solely for that use, as is preferred.

Continuing still to refer to FIG. 3, by in this manner determining that an error occurs while executing a particular testing subroutine of the POST 40, the source of the error within a particular PWA of the UUT 6 and the location of the occurrence of the error on that PWA may be more particularly narrowed. Those skilled in the art will be capable of determining operations in a particular PWA of particular testing subroutines and steps thereof and can readily make comparison of errors detected by the present method occurring during a testing subroutine run to determine locations of errors in a particular PWA.

Figure 4:
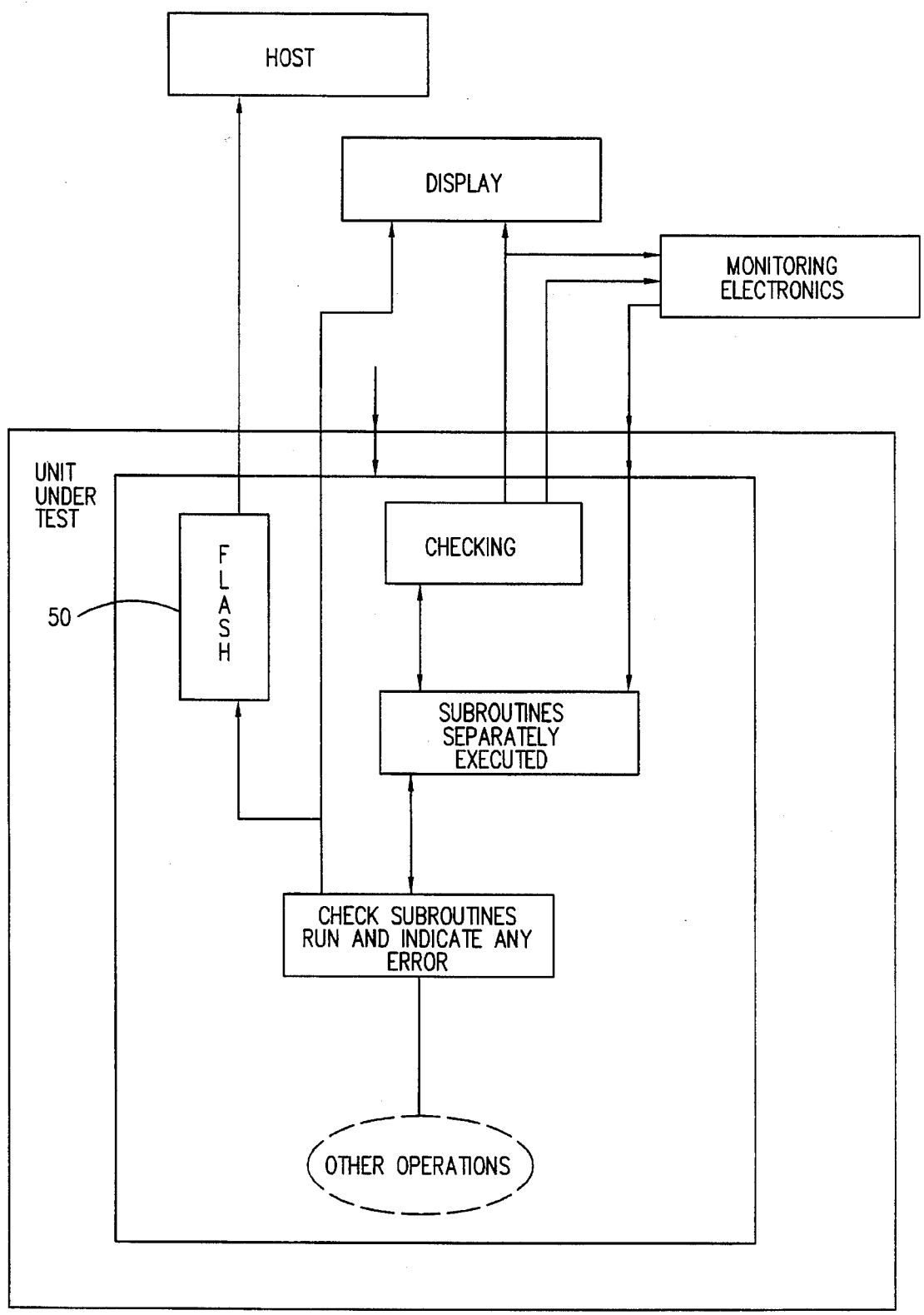
FIG. 4 is a simplified flow diagram of an alternative embodiment of the method of FIG. 3 in which a FLASH chip is employed to return identification information to the POST.

Now referring to FIG. 4, a flow diagram of an alternative embodiment of the present invention method is illustrated. This alternative embodiment is substantially identical to the embodiment illustrated in FIG. 3 in that, in the alternative embodiment, the POST 40 generates the same error signals upon occurrence of a testing subroutine run error; the POST 40 checks for an externally generated command to the POST 40 at a communication port which command is indicative of such an error; the POST 40 loops and separately executes each testing subroutine upon detection of the externally generated command 34 (shown in FIG. 3) indicative of the error; and the POST 40 sends a signal 38 (shown in FIG. 3) to aspects of the assembly 2 (shown in FIG. 1) when an error occurs in the running of a separately executed testing subroutine.

Still referring to FIG. 4, in addition in this alternative embodiment, however, the externally generated command 34 (shown in FIG. 3) to the POST 40 directs the POST 40 to send embedded information contained in a FLASH chip 50, which information represents identification barcode data (or other identifying data) that has been previously scanned and written into the FLASH 50 at an earlier functional test process. This alternative embodiment allows for accurate and automated subassembly tracking, such as, for example, at a functional prescreen station which occurs just prior to loading the UUT 6 in the testing assembly 2. Numerous other alternative embodiments of the method which are in keeping with the general principles herein are also possible, such as that external commands could allow passing of testing to an external FLASH chip which contains alternate POST testing routines and others.

As is clearly seen, the present invention overcomes the problems presented by the prior technology ESS techniques and the limited capabilities of existing POST routines to provide a much improved system and method for detecting and locating the source of failures in PWA's. The present invention system and method are believed to be especially effective when performed and employed as described herein, however, those skilled in the art will readily recognize that numerous variations, substitutions, and additions may be made in the invention system and method and in their configuration and steps to achieve substantially the same results as achieved by the embodiments and, in particular, the preferred embodiments, expressly described herein. Each of those variations is intended to be included in the description herein and forms a part of the present invention. The foregoing detailed description is, thus, to be clearly understood as being given by way of illustration and example only, the spirit and scope of the present invention being limited solely by the appended claims.

What is claimed is:

1. A system for detecting and locating failure errors in a printed wire assembly contained in a device performing a power on self test comprised of testing subroutines, said testing subroutines are location detection subroutines, said printed wire assemblies being tracked through a manufacturing process by a factory tracking system, comprising:

circuitry for monitoring said device to determine whether a run error results on execution of said power on self test, said circuitry for monitoring being in communication with said device;

circuitry for generating a command to said device in response to detection of said run error by said circuitry for monitoring, said circuitry for generating being in communication with said circuitry for monitoring and wherein said circuitry for generating is external to said device and said command is input to said device and alerts said power on self test to separately execute each of said testing location detection subroutines;

circuitry for causing said power on self test to separately execute said testing location detection subroutines, said circuitry for causing being in communication with said circuitry for generating and being activated to begin separately executing said testing location detection subroutines of said power on self test upon receipt by said device of said command from said circuitry for generating;

circuitry for signalling said system when a subroutine run error occurs during separate execution of said testing location detection subroutines, said circuitry for signalling being in communication with said system.

2. The system of claim 1, wherein said system locates said failure errors in said printed wire assembly, at least in part, by detecting which of said testing subroutines was running at the time said subroutine error occurred.

3. The system of claim 1, wherein said device has communication port pins and said circuitry for monitoring connects with said communication port pins to perform monitoring.

4. The system of claim 1, wherein said circuitry for generating said command is external to said device and said command is input to said device and alerts said power on self test to separately execute each of said testing subroutines.

5. The system of claim 1, wherein said circuitry for causing said power on self test to separately execute said testing subroutines is, at least in part, inherent in said power on self test.

6. The system of claim 1, wherein said circuitry for signalling is activated by said power on self test.

7. The system of claim 3, wherein said circuitry for monitoring checks one of said communication port pins to determine occurrence of said run error.

8. The system of claim 1, wherein said device includes a FLASH chip in which is embedded identifying information helpful in identifying said device and said printed wire assembly in which said subroutine run error occurs.

9. The system of claim 3, wherein said command is delivered to said device via one of said communication port pins.

10. A system for detecting and locating failure errors in a printed wire assembly contained in a device performing a power on self test comprised of testing subroutines, said testing subroutines are location detection subroutines, said printed wire assemblies being tracked through a manufacturing process by a factory tracking system, comprising:

circuitry for connecting with said device to monitor said power on self test for an error signal from said device due to a run error in said power on self test and to deliver a command to said device, said command directing said power on self test to separately execute each of said testing location detection subroutines, wherein said circuitry for connecting is external to said device and said command is input to said device and alerts said power on self test to separately execute each of said testing location detection subroutines;

circuitry for detecting a subroutine run error during execution of any of said testing location detection subroutines;

circuitry for determining in which of said testing location detection subroutines said subroutine run error occurs; and circuitry for communicating to said system in which of said testing subroutines location detection said subroutine run error occurs.

11. The system of claim 10, wherein said circuitry for connecting includes monitoring electronics, a host system, and a factory tracking system.

12. The system of claim 10, wherein said circuitry for connecting is coupled to a communication port of said device, wherein said command is delivered via a pin of said communication port.

13. The system of claim 10, wherein said circuitry for detecting and said circuitry for determining are inherent in said power on self test.

14. The system of claim 10, wherein said device includes a FLASH chip in which is embedded identifying information helpful in identifying said device and said printed wire assembly in which said subroutine run error occurs.

15. The system of claim 12, wherein said pin is reserved for use in delivering said command.

16. A method for detecting and locating failure errors in a printed wire assembly contained in a device performing a power on self test comprised of testing subroutines, said testing subroutines are location detection subroutines, said printed wire assemblies being tracked through a manufacturing process by a factory tracking system, comprising:

monitoring said device to determine whether a run error results on execution of said power on self test;

generating a command to said device in response to detection of said run error, wherein said generating is performed by circuitry external to said device and said command is input to said device and alerts said power on self test to separately execute each of said testing location detection subroutines;

separately executing each of said testing subroutines in response to said command; and signalling said system when a subroutine run error occurs during separate execution of said testing location detection subroutines.

17. The method of claim 16, further comprising identifying in which of said testing subroutines said subroutine run error occurs.

18. The method of claim 16, wherein said command to said device is delivered to said device via a single communication port pin of said device.

* * * * *